United States Patent
Miyazawa (10) Patent No.: US 9,488,915 B2
(45) Date of Patent: Nov. 8, 2016

(54) REAGENT FOR ENHANCING GENERATION OF CHEMICAL SPECIES

(71) Applicant: TOYO GOSEI CO., LTD., Inzai-shi (JP)

(72) Inventor: Takashi Miyazawa, Inzai (JP)

(73) Assignee: TOYO GOSEI CO., LTD., Ichikawa-shi, Chiba (JP)

( * ) Notice: Subject to any disclaimer, the term of this patent is extended or adjusted under 35 U.S.C. 154(b) by 0 days.

(21) Appl. No.: 14/547,097

(22) Filed: Nov. 18, 2014

(65) Prior Publication Data

US 2015/0141687 A1 May 21, 2015

Related U.S. Application Data

(60) Provisional application No. 61/962,860, filed on Nov. 18, 2013.

(51) Int. Cl.
| | | |
|---|---|---|
| *C07F 7/00* | (2006.01) | |
| *G03F 7/075* | (2006.01) | |
| *G03F 7/004* | (2006.01) | |
| *G03F 7/039* | (2006.01) | |
| *G03F 7/20* | (2006.01) | |

(52) U.S. Cl.
CPC ........... *G03F 7/0755* (2013.01); *G03F 7/0045* (2013.01); *G03F 7/0397* (2013.01); *G03F 7/203* (2013.01); *G03F 7/2022* (2013.01)

(58) Field of Classification Search
CPC .................................................. G03F 7/0755
USPC ......................................................... 556/455
See application file for complete search history.

(56) References Cited

U.S. PATENT DOCUMENTS

| | | | |
|---|---|---|---|
| 7,585,933 B2 * | 9/2009 | Motohiro | ............. C08G 83/003 427/58 |
| 7,851,252 B2 | 12/2010 | Nealey et al. | |
| 2014/0361275 A1 | 12/2014 | Osaki et al. | |
| 2015/0060728 A1 | 3/2015 | Enomoto et al. | |
| 2015/0141687 A1 | 5/2015 | Miyazawa | |
| 2015/0274871 A1 | 10/2015 | Osaki et al. | |
| 2016/0145274 A1 | 5/2016 | Miyazawa | |

OTHER PUBLICATIONS

Miller et al., J. Amer. Chem. Soc. (1976), 98(9), 2544-50.*
Kalyani et al., J. Amer. Chem. Soc. (2010), 132(24), 8419-8427.*
Application for U.S. Appl. No. 14/392,350, sharing common inventors, available on the U.S. Patent Office website (no copy provided).
Application for U.S. Appl. No. 14/915,496, sharing common inventors, available on the U.S. Patent Office website (no copy provided).
Application for U.S. Appl. No. 15/027,855, sharing common inventors, available on the U.S. Patent Office website (no copy provided).

* cited by examiner

*Primary Examiner* — Porfirio Nazario Gonzalez
*Assistant Examiner* — Kofi Adzamli
(74) *Attorney, Agent, or Firm* — TraskBritt P.C.

(57) ABSTRACT

A reagent that enhances acid generation of a photoacid generator and composition containing such reagent is disclosed. Described is a reagent that generates a first chemical species in at least one of a composition including the reagent, a solution of the composition, and a film formed of the composition. Further described is a reagent that generates a first product in at least one of a composition including the reagent, a solution of the composition, and a film formed of the composition.

10 Claims, 1 Drawing Sheet

FIG. 1

REAGENT FOR ENHANCING GENERATION OF CHEMICAL SPECIES

CROSS-REFERENCE TO RELATED APPLICATION

This application claims the benefit under 35 U.S.C. §119 (e) of U.S. Provisional Patent Application Ser. No. 61/962,860 filed on Nov. 18, 2013, the entirety of which is hereby incorporated herein in its entirety by this reference.

TECHNICAL FIELD

This application relates generally to chemistry and more specifically to a reagent that can produce a product enhancing a generation of a chemical species, such as acid and/or base from a precursor. Such product can transfer its energy or electron to the precursor or accept the precursor's energy or electron.

BACKGROUND

Current high-resolution lithographic processes are based on chemically amplified resists (CARs) and are used to pattern features with fine dimensions.

Methods for forming pattern features with fine dimensions is disclosed in U.S. Pat. No. 7,851,252 (filed on Feb. 17, 2009), the entirety of which is incorporated herein by this reference.

BRIEF SUMMARY

An aspect hereof relates to a reagent capable of generating a first chemical species in at least one of a composition including the reagent, a solution of the composition, and a film formed of the composition. As the case may be, such composition(s) may not contain any constituent other than such reagent.

With regard to such a reagent, it is preferred that the first chemical species is one of a group consisting of a radical, an ion, and a reactive intermediate containing an atom with unusual valence. Typical examples of such reactive intermediate are carbene and silylene. One concrete example of the first chemical species is a radical that is formed through cleavage of a bond between two atoms, one of which bonded to an aromatic group.

With regard to such a reagent, it is preferred that the first chemical species is generated by a first exposure of at least one of the composition, the solution and the film to at least one of a first electromagnetic ray and a first particle ray.

Another aspect hereof relates to a reagent capable of generating a first product in at least one of a composition including the reagent, a solution of the composition and a film formed of the composition. As the case may be, such composition may not contain any constituent other than such reagent. Several concrete examples of such first product are condensed aromatic compounds and compounds having multiple bonds and at least one aromatic group.

With regard to such a reagent, it is preferred that: the reagent has a first conjugated system; the first product has a second conjugated system; and the second conjugated system is more extended than the first conjugated system. One concrete example of such first conjugated system is the aromatic group itself, while one concrete example of such second conjugated system is condensed aromatic group larger than the first conjugated system.

With regard to such a reagent, it is preferred that the first product is generated through a formation of a first bond between a first atom and a second atom. One concrete example of such first product is a compound formed from intramolecular cyclization reaction.

With regard to such a reagent, it is preferred that the first atom is not bonded to the second atom in the reagent.

With regard to such a reagent, it is preferred that the formation of the first bond occurs by a second exposure of at least one of the composition, the solution and the film to at least one of a second electromagnetic ray and a second particle ray. Typical examples of reactions in which the formation of the first bond are intramolecular cyclization reactions forming compounds having ring-fused structure such as dihydrophenthrene.

With regard to such a reagent, it is preferred that the second exposure is carried out in the presence of oxygen molecules. Typically, oxygen molecules can enhance aromatization of compounds having a ring-fused structure formed by such intramolecular cyclization reactions.

With regard to such a reagent, it is preferred that the first chemical species be generated by having a hydrogen atom of the reagent abstracted.

With regard to such a reagent, it is preferred that the first chemical species be directly or indirectly converted into a second product in at least one of the composition, the solution and the film.

With regard to such a reagent, it is preferred that the second product is a result of eliminations of at least two atoms of a third atom bonded to a fourth atom and a fifth atom bonded to a sixth atom from the reagent. One concrete example of such second product is a compound having at least one multiple bond which is formed by such elimination reaction.

With regard to such a reagent, it is preferred that: the reagent has a seventh atom and an eighth atom; and the second product is a result of formation of a multiple bond between the seventh atom and the eighth atom.

With regard to such a reagent, it is preferred that the reagent has a third pi-electron system and a fourth pi-electron system; and the third pi-electron system is conjugated with the fourth pi-electron system in the second product through the multiple bond. One concrete example of such second product is ethene or acetylene having at least one aromatic group.

With regard to such a reagent, it is preferred that the bond between the seventh atom and the eighth atom is a single bond in the reagent.

With regard to such a reagent, it is preferred that a first interaction between the third pi-electron system and the fourth pi-electron system in the reagent is weaker than a second interaction between the third pi-electron system and the fourth pi-electron system in the second product. In one concrete example of the reagent, such interaction is weaker because the third pi-electron system is connected to the fourth pi-electron system through at least single bond.

With regard to such a reagent, it is preferred that the cut-off wavelength of an absorption spectrum in the ultraviolet and visible region of the reagent is shorter than the cut-off wavelength of absorption spectrum in the ultraviolet and visible region of the second product.

With regard to such a reagent, it is preferred that the second product is capable of being converted into a third product in at least one of a composition including at least one of the reagent and the second product, a solution of the composition and a film formed of the composition. Such composition may contain both the reagent and the second product. With regard to such a reagent, it is preferred that the second product is converted into the third product by a third exposure of at least one of the composition, the solution and the film to at least one of a third electromagnetic ray and a third particle ray.

With regard to such a reagent, it is preferred that the third exposure is carried out in the presence of oxygen molecules.

With regard to such a reagent, it is preferred that: the second product has a first aromatic group and a second aromatic group; and the third product has a ring-fused structure. Typical examples of the third product are phenanthrene derivatives or anthracene derivatives.

With regard to such a reagent, it is preferred that the first aromatic group electrically interacts with the second aromatic group. Typically, in the second product electrons are more delocalized compared to such reagent.

With regard to such a reagent, it is preferred that the first aromatic group electrically interacts with the second aromatic group through at least one multiple bond.

With regard to such a reagent, it is preferred that the at least one multiple bond includes a carbon-carbon double bond.

With regard to such a reagent, it is preferred that the highest occupied molecular orbital (HOMO) of the reagent is lower than the highest occupied molecular orbital (HOMO) of the second product. This can lead to lowering excitation energy for the second product.

With regard to such a reagent, it is preferred that: the reagent has the first aromatic group and the second aromatic group; and the first aromatic group is connected to the second aromatic group through at least one carbon-carbon single bond in the reagent.

With regard to such a reagent, it is preferred that the first electromagnetic ray and the first particle ray are an extreme ultraviolet (EUV) light and an electron beam (EB), respectively.

With regard to such a reagent, it is preferred that a first interplay between the second product and a first compound enhances a generation of a second chemical species from the first compound. Several concrete examples of the second chemical species are acid, base and radical.

With regard to such a reagent, it is preferred that the first interplay is induced by a first excitation of at least one of the second product and the first compound. Typical examples of such interplay are electron transfer, energy transfer and photosensitization. One concrete example of the second product is initiator which generates acid, base or radical.

With regard to such a reagent, it is preferred that the first excitation is carried out by a fourth exposure of at least one of the composition, the solution and the film to at least one of a fourth electromagnetic ray and a fourth particle ray.

With regard to such a reagent, it is preferred that a second interplay of the third product and a second compound enhances a generation of a third chemical species from the second compound. Typical examples of such interplay are electron transfer, energy transfer and photosensitization.

With regard to such a reagent, it is preferred that the second interplay is induced by a second excitation of at least one of the third product and the second compound.

With regard to such a reagent, it is preferred that the second excitation is carried out by a fifth exposure of at least one of the composition, the solution and the film to at least one of a fifth electromagnetic ray and a fifth particle ray.

With regard to such a reagent, it is preferred that: the second compound is photo acid generator (PAG); and the third chemical species is acid.

With regard to such a reagent, it is preferred that: the first compound is photo acid generator (PAG); and the second chemical species is acid.

With regard to such a reagent, it is preferred that at least one electron-donating substituent is connected to at least one of the first aromatic group and the second aromatic group; and at least one electron-donating group is connected to the ring fused structure.

With regard to such a reagent, it is preferred that the first excitation is carried out by the fourth exposure of at least one of the composition, the solution and the film to a first ultraviolet light as the fourth electromagnetic ray.

With regard to such a reagent, it is preferred that the second excitation is carried out by the fifth exposure of at least one of the composition, the solution and the film to a second ultraviolet light as the fifth electromagnetic ray.

With regard to such a reagent, it is preferred that a wavelength of the first ultraviolet light is longer than 250 nm.

With regard to such a reagent, it is preferred that a wavelength of the second ultraviolet light is longer than 250 nm.

An aspect hereof relates to a composition includes the reagent and the first compound aforementioned.

Another aspect of the disclosure relates to a composition includes the reagent and the second compound aforementioned.

Another aspect of the disclosure relates to a composition includes a precursor and a reagent represented by the following formula.

where:

$R^1$ is a is a hydrogen atom, a halogen atom, an alkyl group, an alkenyl group, an aryl group, an aralkyl group, an alkynyl group, an alkyl group containing a cyclic or poly cyclic moiety, or a substituent containing at least one atom other than carbon atom and hydrogen atom;

$R^2$ is a hydrogen atom, an alkyl group, an alkenyl group, an aryl group, an aralkyl group, an alkynyl group, an alkyl group containing a cyclic or poly cyclic moiety, or a substituent containing at least one atom other than carbon atom and hydrogen atom;

$R^3$ is a hydrogen atom, an alkyl group, an alkenyl group, an aryl group, an aralkyl group, an alkynyl group, an alkyl group containing a cyclic or poly cyclic moiety, or a substituent containing at least one atom other than carbon atom and hydrogen atom;

$R^4$ is a hydrogen atom, an alkyl group, an alkenyl group, an aryl group, an aralkyl group, an alkynyl group, an alkyl group containing a cyclic or poly cyclic moiety, or a substituent containing at least one atom other than carbon atom and hydrogen atom;

$R^5$ is a hydrogen atom, an alkyl group, an alkenyl group, an aryl group, an aralkyl group, an alkynyl group, an alkyl group containing a cyclic or poly cyclic moiety, or a substituent containing at least one atom other than carbon atom and hydrogen atom; and $R^6$ is a hydrogen atom, an alkyl group, an alkenyl group, an aryl group, an aralkyl group, an alkynyl group, an alkyl group containing a cyclic or poly cyclic moiety, or a substituent containing at least one atom other than carbon atom and hydrogen atom.

With regard to such composition, it is preferred that $R^1$ is capable of being eliminated in at least one of such composition, a solution of such composition and a film formed of such composition.

With regard to such composition, it is preferred that $R^1$ is capable of being abstracted by a reactive intermediate generated in at least one of such composition, a solution containing such composition and a film formed of such composition.

With regard to such composition, it is preferred that $R^6$ is capable of being eliminated in at least one of such composition, a solution of such composition and a film formed of such composition.

With regard to such composition, it is preferred that $R^6$ is capable of being abstracted by a reactive intermediate generated in at least one of such composition, a solution containing such composition and a film formed of such composition.

With regard to such composition, it is preferred that $R^1$ is capable of being abstracted by a reactive intermediate generated in at least one of such composition, a solution containing such composition and a film formed of such composition by a sixth exposure of the at least one of such composition, the solution and the film to at least one of a sixth electromagnetic ray and a sixth particle ray.

With regard to such composition, eliminations of groups $R^1$ and $R^6$ may be stepwise or concerted. In a typical stepwise pattern of eliminations, abstraction of group $R^1$ is followed by the elimination of group $R^6$. In a typical concerted pattern of the eliminations, groups $R^1$ and $R^6$ are eliminated simultaneously.

One of typical stepwise patterns of eliminations is as follows.

An alkane (A-1) relating to an aspect hereof generates a corresponding radical (A-2) through an abstraction reaction of group $R^1$ by a chemical species such as reactive intermediate (RI), a reagent such as nucleophilic reagent and electrophilic reagent or a cleavage reaction of the $C^1$—$R^1$ bond. Typically, the abstraction reaction forms a product in which group $R^1$ is bonded to RI while the cleavage reaction forms a radical of group $R^1$. The radical discharges an electron to form a corresponding cation (A-3). The cation forms an olefin (A-4) by elimination of $R^6$. Typically, $R^6$ is eliminated as a corresponding cation.

One of typical concerted patterns of eliminations is as follows. A reaction triggered by attack of nucleophilic reagent (NR) on group $R^6$ occurs to induce simultaneous eliminations of group $R^1$ and $R^6$ to yield an olefin (B-3). Typically, $R^1$ is eliminated as an anion. A reaction triggered by attack of electrophilic reagent or radical on group $R^6$ may also form such olefin.

With regard to such composition, it is preferred that: the reagent is capable of generating a third chemical species by having $R^1$ eliminated; and the precursor is capable of generating a fourth chemical species by an interaction between the third chemical species and the precursor. Several concrete examples of the third chemical species are radial, cation and anion. One concrete example of the precursor is initiator which generates acid, base or radical while one concrete example of the fourth chemical species is acid, base or radical.

With regard to such composition, it is preferred that: eliminations of $R^1$ and $R^6$ form a fourth product directly or indirectly; and a third interplay between the fourth product and the precursor generates a fifth chemical species. Several concrete examples of the fourth product are condensed aromatic compound and compound having multiple bond and at least one aromatic group while one concrete example of the fifth chemical species is acid, base or radical.

With regard to such composition, it is preferred that: at least one of $R^2$ and $R^3$ is an aryl group; and at least one of $R^4$ and $R^5$ is an aryl group. This can enhance the formation of the third chemical species because of electron delocalization.

With regard to such composition, it is preferred that $R^6$ is a substituent containing at least one atom other than carbon atom and hydrogen atom. This can enhance the elimination reaction of $R^6$.

With regard to such composition, it is preferred that $R^6$ is a substituent containing at least one of silicon, germanium, stannum and lead. Such substituent can stabilize β cation and easily eliminated as cations.

With regard to such composition, it is preferred that $R^6$ is capable of being eliminated as a cation.

With regard to such composition, it is preferred that a carbon atom which has been bonded to $R^1$ takes on a positive charge after $R^1$ is eliminated. Typically, such positive charge can be stabilized by $R^6$ such as substituent containing silicon, germanium, stannum and lead.

With regard to such composition, it is preferred that the forth product has a fused-ring structure.

With regard to such composition, it is preferred that the forth product is generated from a fifth product by an irradiation of the fifth product with a light. One concrete example of the fifth product is a compound having multiple bonds and at least one aromatic group.

With regard to such composition, it is preferred that the precursor is a photoacid generator (PAG).

With regard to such composition, it is preferred that the precursor is an organic salt containing an iodonium ion or a sulfonium ion.

With regard to such a reagent, it is preferred that the first chemical species is a benzyl-type radical.

Another aspect of the disclosure relates to a method for manufacturing a device, including: applying a solution of one of the aforementioned compositions to a member such that the film including the composition is formed on the member; and first exposing the film to at least one of a seventh electromagnetic ray and a seventh particle ray such that a first portion of the film is exposed to the at least one of the seventh electromagnetic ray and the seventh particle ray while a second portion of the film is not exposed to the at least one of the seventh electromagnetic ray and the seventh particle ray; and second exposing the film to at least one of an eighth electromagnetic ray and an eighth particle ray such that the first portion of the film is exposed to the at least one of the eighth electromagnetic ray and the eighth particle ray.

With regard to such method, it is preferred that the second exposing is carried out such that at least a part of the second portion is exposed to the at least one of the eighth electromagnetic ray and the eighth particle ray.

With regard to such method, it is preferred that the second exposing is carried out such that a first area including the first portion of the film exposed to the at least one of the seventh electromagnetic ray and the seventh particle ray is smaller than a second area including the first portion of the film exposed to the at least one of the eighth electromagnetic ray and the eighth particle ray.

With regard to such method, it is preferred that such method further includes removing the first portion or the second portion.

With regard to such method, it is preferred that such method further includes etching the member such that a third portion of the member on which the first portion or second portion have been present is etched.

With regard to such method, it is preferred that the seventh electromagnetic ray and the seventh particle ray are an extreme ultraviolet (EUV) light and an electron beam (EB), respectively.

With regard to such method, it is preferred that such composition further includes a third compound which is capable of reacting with the second chemical species.

With regard to such method, it is preferred that the third compound has a protecting group, which is to be deprotected by the second chemical species.

With regard to such method, it is preferred that the film is exposed to oxygen or air containing oxygen before the second exposing is carried out. Typically, oxygen enhances the aromatization of a product formed by photochemical intramolecular cyclization to yield another product which can act as a photosensitizer.

With regard to such method, it is preferred that the second exposing is carried out in the presence of oxygen molecules. Typically, oxygen molecules enhance the aromatization of a product formed by photochemical intramolecular cyclization to yield another product which can act as a photosensitizer. Such subsequent process like such exposure of the composition to oxygen molecules can be carried out in a chamber other than a chamber in which the exposure to at least one of the seventh electromagnetic ray and the second particle ray is carried out. Another aspect of the disclosure relates to a method for manufacturing a device, including: applying a solution of one of the aforementioned compositions to a member such that the film including the composition is formed on the member; first exposing the film to at least one of a seventh electromagnetic ray and a seventh particle ray such that a first portion of the film is exposed to the at least one of the seventh electromagnetic ray and the seventh particle ray while a second portion of the film is not exposed to the at least one of the seventh electromagnetic ray and the seventh particle ray; generating the third product; and second exposing the film to at least one of an eighth electromagnetic ray and an eighth particle ray such that the first portion of the film is exposed to the at least one of the eighth electromagnetic ray and the eighth particle ray.

With regard to such method, it is preferred that the third product is generated through intramolecular cyclization reaction of the second product.

With regard to such method, it is preferred that the third product is generated by a photoreaction of the second product.

Another aspect of the disclosure relates to a method for manufacturing a device which is characterized in that: the method is carried out by using any one of the aforementioned compositions as a photoresist.

A reagent relating to an aspect hereof is able to produce a reactive intermediate enhancing generation of a chemical species such as acid and base.

Typically, such reactive intermediate assists the generation of Brönsted acid or base from a precursor. Furthermore, such reagent can apply to the generation of Lewis acid and base. Typically, such reactive intermediate is formed by an exposure of the reagent to an electromagnetic ray or a particle ray. More typically, extreme ultraviolet (EUV) light and electron beam (EB) are used as such electromagnetic ray and particle ray, respectively.

The precursor generates such chemical species through electron transfer or energy transfer involved with the reactive intermediate. Such reagent may have a hydrogen atom easily abstracted by unstable radical species and the reactive intermediate generated from reagent has a reducing character.

Typically, such reagent is capable of generating a carbon radical stabilized by α-aryl functional groups. Examples for such reagents are benzyl derivatives, α-aryl-α-alkyl derivatives, α-diaryl-alkyl derivatives, α-diaryl-β-aryl alkyl derivatives, α-diaryl-β-diaryl alkyl derivatives. Such stabilized carbon radical transfers its electron to PAG due to its reducing character.

It is preferred that such reagent has an elimination group. The introduction of such elimination group into reagent enhances conversion from such carbon radical into a corresponding product which may have an extended conjugated system. Typical examples of such elimination group are silyl group, germyl group and stannyl group having at least one alkyl group or aryl group. Since such typical groups can stabilize β cation and be easily eliminated as a corresponding cation, such conversion is easily enhanced.

1,2-diaryl alkane (Reagent A) represented by the following formula is one of typical examples of such reagents.

Reagent A

Such alkane has a first carbon atom ($C^1$) bonded to one aryl group ($Ar^1$) and group X and a second carbon atom ($C^2$) bonded to $C^1$, another aryl group ($Ar^2$) and group M. X and M are capable of being eliminated. It is preferred that group X is a substituent or group readily eliminated or abstracted by other chemical species or reactive intermediates. Typical examples of group X are a hydrogen atom, a halogen atom, a chalcogen atom to which at least one substituent is bonded and a group containing atom which is bonded to $C^1$ and is an atom other than carbon atom and hydrogen atom such as silyl group, germyl group and stannyl group. $Ar^1$ can be identical to $Ar^2$ or different from $Ar^2$. Examples of $Ar^1$ and $Ar^2$ are phenyl, naphthyl, anthryl, phenanthryl and pyrenyl. Such aryl group can contain at least one hetero atom like thiophenyl, furyl, pyridyl, quinolyl, benzoquinolyl, carbazolyl, phenothiazinyl, benzofuryl, benzothiophenyl, dibenzofuryl, or dibenzothiophenyl groups.

Such aryl group can have at least one substituent. Examples of such substituent are electron-donating group and electron-accepting group. Examples of such electron-donating group are alkyl, hydroxy, alkoxy, aryloxy, amino, alkylamino, dialkylamino, alkylthio and arylthio groups. Examples of such electron-accepting group are nitro group, cyano group, trifluoromethyl group, halogen group, ammonium group and sulfonium group. To strengthen formation of alkene through A-3 described above, it is preferred that at least one electron-donating group is introduced onto such aryl group because such electron-donating group can stabilize cation such as A-3.

It is preferred that group M is a substituent or group readily eliminated or abstracted by other chemical species or reactive intermediates. Typical examples of group M are a hydrogen atom, a halogen atom, a chalcogen atom to which at least one substituent is bonded and a group containing atom which is bonded to $C^2$ and is an atom other than carbon atom and hydrogen atom such as silyl group, germyl group and stannyl group.

The eliminations of groups X and M from Reagent A may be stepwise or concerted. In a typical stepwise mechanism of the eliminations, abstraction of group X is followed by the elimination of group M. In a typical concerted mechanism of the eliminations, groups X and M are eliminated simultaneously.

Typically, each of $R^1$ bonded to $C^1$ and $R^2$ bonded to $C^2$ may be an alkyl group in such alkane. However, at least one of $R^1$ and $R^2$ can be an aryl group depending on desired properties such as photophysical property, photochemical property and solubility.

A typical product (Product A) generated by the eliminations of groups X and M from the aforementioned alkane is represented by the following formula. In case that one desires to make such product absorb a longer-wavelength light, an aryl group can be introduced to the aforementioned alkane as $R^1$ or $R^2$. Both $R^1$ and $R^2$ can be same or different aryl groups. Product A is one concrete example of the second product or the first product mentioned above.

Product A

Typically, at least one of the eliminations of groups X and M is accompanied with or followed by release of electron from Reagent A. The released electron may be accepted by another substance such as a precursor generating a chemical species. One of typical examples of such precursor is photo acid generator (PAG).

Product A itself can act as photosensitizer which senses an UV or a visible light and donates an electron or energy to another substance or accept an electron or energy from another substance. Product A can assist the generation of chemical species such as acid and base from a precursor by an interaction with the precursor. Typically, the generation of chemical species is enhanced by an excitation of Product A, a composition containing Product A or a film containing Product A.

If one desires to make Product A absorb a longer-wavelength light, moiety having a ring-fused structure such as naphthyl group and anthryl group or plural aromatic group such as biphenyl group can be used as at least one of $Ar^1$, $Ar^2$, $R^1$ and $R^2$.

Typically, Product A can be converted into phenanthrene derivative (Product B) represented the following formula. Typically, Product B is formed by a photoreaction of Product A which is referred to as photochemical intramolecular cyclization.

Product B

Product B can act as photosensitizer which senses an UV or a visible light and donates an electron or energy to another substance or accept an electron or energy from another substance. Product B can assist the generation of chemical species such as acid and base from a precursor by an interaction with the precursor. Typically, the generation of chemical species is enhanced by an excitation of Product B, a composition containing Product B or a film containing Product B. Product B is one concrete example of the third product or the first product mentioned above.

In case that one desires to make Product A or Product B act as an electron donor, it is preferred that at least one electron-donating group such as alkoxy group, alkylamino and alkylthio group is introduced to at least one of $Ar^1$, $Ar^2$, $R^1$ and $R^2$ of Reagent A. It is more preferable that each of $Ar^1$ and $Ar^2$ has at least one electron-donating group. This can improve the electron-donating ability of such radicals or chemical species generated from such reagent.

As described above, a reagent relating to an aspect hereof can have condensed aromatic group. Several concrete examples of such reagent are provided as follows.

2-N-P-E

A reagent having naphthyl group or condensed aromatic group larger than naphthyl group can provided condensed aromatics larger than phenanthrene such as benzo[c]phenanthrene (BP), benzo[c]chrysene (BC) and dibenzo[c,g]phenanthrene. It is preferred that the substituents M are bonded to carbon atoms bonded to aromatic groups and has eliminable nature to yield corresponding ethens, which can act as photosensitizers. Finally, corresponding condensed aromatic compounds which can also act as photosensitizers are formed through intramolecular cyclization reaction followed by oxidation. According to light to be used for photosensitization reaction, aromatic group can be selected properly. One of typical compositions relating to an aspect hereof includes at least one of reagents mentioned above, a precursor which is to form a chemical species, and a compound that is to react with the chemical species can be applied as a photoresist such as chemically-amplified resist (CAR) to manufacturing of electronic devices such as semiconductor device and electro-optical device.

BRIEF DESCRIPTION OF THE DRAWING

In the drawings, which illustrate what is currently considered to be the best mode for carrying out the invention.

DETAILED DESCRIPTION

The disclosure is further described with the aid of the following illustrative Examples.

Experimental Procedures

Synthesis of 1,1,2-tris(4-methoxyphenyl) ethene

In a 300 ml. three-necked flask, fitted with a mechanical stirrer, a reflux condenser, and a separatory funnel, are placed 2.43 g. of magnesium turnings, 50 cc. of dry tetrahydrofuran, dibromoethane, and a 0.5- to 1-cc. portion of 15.7 g. (115 cc., 1 mole) of freshly distilled 4-methoxybenzyl chloride. In a few minutes the reaction starts and is controlled by cooling with a wet towel. The stirrer is started, and, in order to form a Grignard reagent of 4-methoxybenzyl chloride, the rest of 4-methoxybenzyl chloride dissolved in 100 cc. of dry tetrahydrofuran is added to the suspension containing the magnesium over two hours while the three-necked flask is cooled in an ice bath. After the addition of the solution of 4-methoxybenzyl chloride, the mixture is stirred for three hours. With the stirrer still running, 24.2 g. of 4,4'dimethoxybenzophenone dissolved in 50 cc. of dry tetrahydrofuran is added to the Grignard reagent dissolved in dry tetrahydrofuran. This requires about thirty minutes, and then the reaction mixture is allowed to stand for two hours.

The flask is placed in an ice bath, 70 g. of cracked ice is added, and the magnesium hydroxide is dissolved by adding 50 cc. of cold 20 percent sulfuric acid. The organic layer is separated, and the water layer extracted with two 50-cc. portions of ether. The ether and tetrahydrofuran are distilled from the combined extracts, and the residual liquid is refluxed for two hours with 10 cc. of 20 percent sulfuric acid to dehydrate the carbinol. The layers are separated and the solvents are evaporated. Recrystallization from 90 cc. of hot 95 percent alcohol and cooling to room temperature gives 20.0 g of 1,1,2-tris(4-methoxyphenyl) ethane.

Synthesis of 1,1,2-tris(4-methoxyphenyl)-2-triethylsilyl-ethane (Reagent 1)

Hydrated chloroplatinic acid (1 g) is dissolved in 2.5 ml of glacial acetic acid. The solutions is diluted with 3.6 ml of water and then heated to 70 degrees Celsius. Dicyanopentadiene (1 ml) is added and the mixture is stirred for 24 hours at room temperature. The crude product is filtered and recrystallized twice from THF. It yields 0.4 g of dicyclopentadienylpiatinum (II) chloride (DPPC).

In a three-necked flask, 0.2 g of triethylhydrosilane and 0.2 g of 1,1,2-tris(4-methoxyphenyl) ethene is dissolved in dry toluene under the protection of nitrogen. DPPC in dichloromethane is added to the mixture. The mixture is heated to reflux 50 hours. The mixture is added to methanol and the precipitate is collected. 0.08 g of 1,1,2-tris(4-methoxyphenyl)-2-triethylsilyl-ethane is obtained by drying the precipitate.

Synthesis of Resin A

A solution containing 5.0 g of α-methacryloyloxy-γ-butylolactone, 6.03 g of 2-methyladamantane-2-methacrylate, and 4.34 g of 3-hydroxyadamantane-1-methacrylate, 0.51 g of dimethyl-2,2'-azobis(2-methylpropionate), and 26.1 g of tetrahydrofuran is prepared. The prepared solution is added dropwise over 4 hours to 20.0 g of tetrahydrofuran placed in flask with stirring and boiling. After the addition of the prepared solution, the mixture is heated to reflux for 2 hours and cooled to room temperature. Addition of the mixture by drops to a mixed liquid containing 160 g of hexane and 18 g of tetrahydrofuran with vigorously stirring precipitates the copolymer. The copolymer is isolated by filtration. Purification of the copolymer is carried out by vacuum drying following twice washings by 70 g of hexane, and thereby 8.5 g of white powder of the copolymer is obtained.

Resin A

Preparation of Samples for Evaluation (Evaluation Samples)

Evaluation Sample 1 is prepared by dissolving 300 mg of resin A, 36.7 mg of 4,4'-di-(t-butylphenyl)iodonium nonafluorobutanesulfonate as a photoacid generator, and 15.0 mg of coumarin 6 as an indicator in 2000 mg of cyclohexanone.

Evaluation Sample 2 is prepared by dissolving 6.0 mg of Reagent 1, 300 mg of resin A, 36.7 mg of 4,4'-di-(t-butylphenyl)iodonium nonafluorobutanesulfonate as a photoacid generator, and 15.0 mg of coumarin 6 as an indicator in 2000 mg of cyclohexanone.

Evaluation of Efficiency of Acid Generation

Films are formed on 4-inch quartz wafers by spin-coating of Evaluation Samples 1 and 2. Each of the films is exposed to electron beams of which volumes are 0, 10, 20, 30 and 40 $\mu C/cm^2$ output by an electron beam lithography apparatus. Subsequent to the electron-beam exposures, the efficiencies for the films are obtained by plotting absorbances at 534 nm which are assigned to quantities of protonated coumarin 6 generated by the exposures to respective volumes of electron beams.

Table 1 shows the relative acid-generation efficiencies for Evaluation Samples 1 and 2. In Table 1, the acid-generation efficiency for Evaluation Sample 1 is used as a benchmark. The results shown in Table 1 indicate that the acid-generation efficiency is improved by Reagent 1. In other words, Reagent 1 functions as an Acid Generation Enhancer (AGE).

TABLE 1

The relative acid-generation efficiencies for Evaluation Samples 1 and 2

| | Relative acid-generation efficiency |
|---|---|
| Evaluation Sample 1 | 1.0 |

TABLE 1-continued

The relative acid-generation efficiencies
for Evaluation Samples 1 and 2

|  | Relative acid-generation efficiency |
|---|---|
| Evaluation Sample 2 | 1.3 |

As understood from the aforementioned results, a reactive intermediate having reducing character generated from Reagent 1 is considered to enhance the efficiency of acid generation.

Evaluation of Sensitivity

Before applying Evaluation Sample 2 to a Si wafer, hexamethyldisilazane (HMDS, Tokyo Chemical Industry) is spin-coated at 2000 rpm for 20 seconds on the surface of Si wafer and baked at 110 degrees Celsius for 1 minute. Then, Evaluation Sample 2 is spin-coated on the surface Si wafers which has been treated with HMDS at 4000 rpm for 20 seconds to form a coating film. The prebake of the coating film is performed at 110 degrees Celsius for 60 seconds. Then the coating film of the Evaluation Sample 2 is exposed to electron beam (EB) output from an EB radiation source. After the EB exposure, an irradiation of the coating film with a UV light is carried out at an ambient condition. After that the UV light exposure, a post-exposure-bake (PEB) is carried out at 100 degrees Celsius for 60 second. The coating film is developed with NMD-3 (tetra-methyl ammonium hydroxide 2.38%, Tokyo Ohka Kogyo) for 60 seconds at 25 degrees Celsius and rinsed with deionized water for 10 seconds. The thickness of the coating film measured using film thickness measurement tool is approximately 150 nm.

A sensitivity ($E_0$ sensitivity) is evaluated by measurements of the doses to form a pattern constituted by 2 μm lines where the thickness of the coating film is not zero and 2 μm spaces where the thickness of the coating film is zero using 30 keV electron beam lithography (EBL) system JSM-6500F (JEOL, beam current: 12.5 pA, <1E-4 Pa) with Beam Draw (Tokyo Technology) while the UV exposures is carried out using FL-6BL (wavelengths of bright line are mainly from 320 nm to 380 nm, Toshiba).

Even if the UV exposure is carried out without a mask, 2 μm spaces are formed in the parts of the coating film which have been exposed to the EB source. This indicates that a product functioning as a photosensitizer sensing the UV light is generated in the parts exposed to the EB irradiation because the PAG and the PAG moiety used for the evaluation exhibit little absorbance in a range from 320 nm to 380 nm.

TABLE 2

The doses for $E_0$ light by an EB and
UV exposure for Evaluation Sample 2

|  | Total dose for $E_0$ | |
|---|---|---|
|  | EB dose [μC/cm²] | UV dose [mJ/cm²] |
| Sample 2 | 23 | 0 |
|  | 15 | 500 |
|  | 5 | 2000 |

Table 2 shows the dose sizes corresponding to $E_0$ sensitivities measured for the Evaluation Sample 2 containing Reagent 1. Table 2 indicates that the doses of the EB exposure decreases with increase of the doses of the UV light exposure. A diarylmethyl radical is formed from Reagent 1 of Evaluation Sample 2 by the EB exposure and the diarylmethyl radical is oxidized to form corresponding ethene which can be excited by the UV light and function as sensitizer to enhance acid generation from the PAG.

Further photoreaction of 1,1,2-tris(4-methoxyphenyl) ethene forms a corresponding dihydrophenanthrene derivative (DPH) which is easily oxidized in the presence of oxygen or oxidizer to form a corresponding phenanthrene derivative (PHD) as the following formula. The phenanthrene derivative (PHD) can also be used as a photosensitizer. Since singlet excited states of compounds having condensed aromatic group like phenanthrene, anthracene and naphthalene have generally long life times of several tens of nanoseconds, such compounds can act as efficient photosensitizers because such compounds have many occasion to interact with another molecules within their lifetimes.

DPH

PHD

Figure 1:
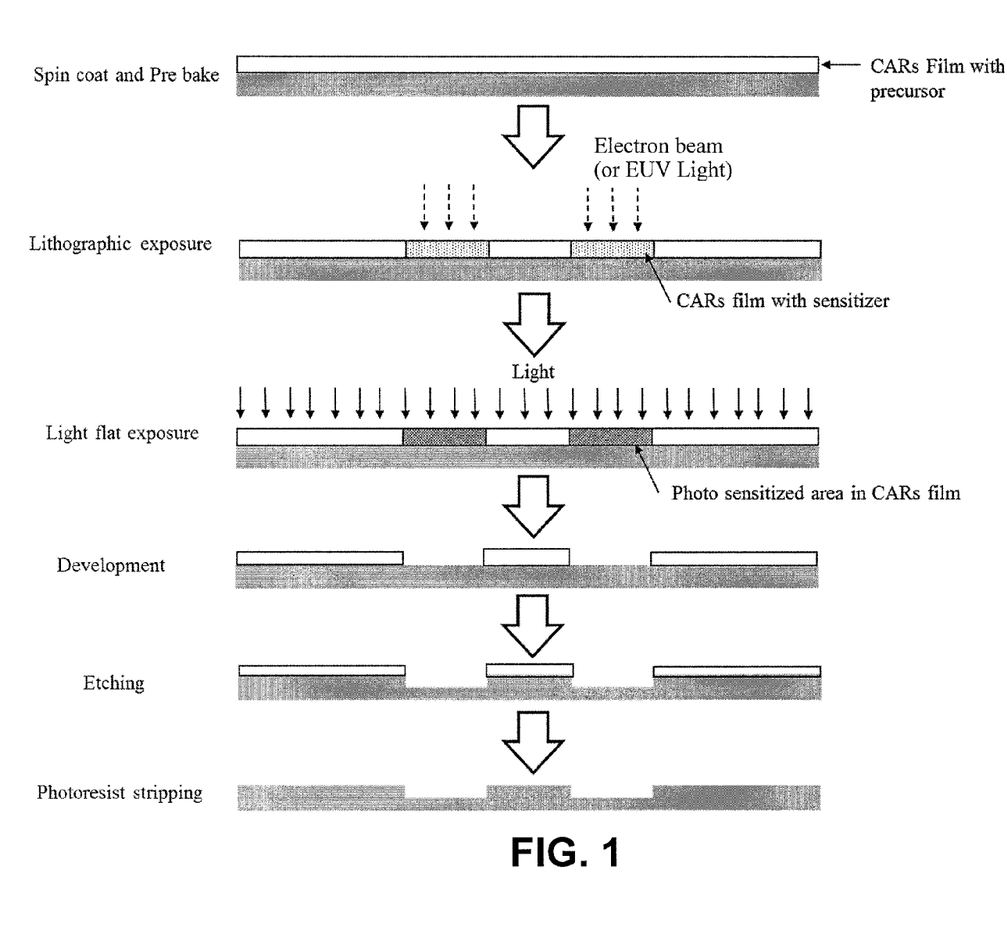
FIG. 1 shows fabrication processes of a device such as integrated circuit (IC) using a CAR containing a reagent relating to an aspect hereof.

FIG. 1 shows fabrication processes of a device such as integrated circuit (IC) using a photoresist including Reagent 1 obtained by the processes by the above procedures.

A silicon wafer is provided. The surface of silicon wafer is oxidized by heating the silicon wafer in the presence of oxygen gas.

A solution of a chemically-amplified composition (CAR) containing Reagent 1, resin A, and a PAG is applied to the surface of the Si wafer by spin coating to form a coating film. The coating film is prebaked.

An irradiation of the coating film with an extreme ultraviolet light (EUV) of which wavelength is 13.5 nm (or an electron beam) is carried out after the prebake of the Si wafer. The deprotection reaction of resin A is induced by acid generated by photoreaction of the PAG and assistance by Reagent 1.

After the EUV irradiation of the coating film, an irradiation of the coating film with an UV light of which wavelength is equal to or longer than 300 nm is carried out. Such light can excites an ethene derivative generated from Reagent 1 and a phenanthrene derivative generated from the ethane derivative by the irradiation with UV light. Such products generated directly and indirectly from Reagent 1 are selectively generated in portions of the coating film which are exposed to the EUV light or EB. Therefore, the exposure of the coating film to the UV light can be carried out without mask.

Development of the coating film which has been irradiated with the EUV light and the UV light is performed after the prebake.

The coating film and the silicon wafer are exposed to plasma. After that, the remaining film is removed.

An electronic device such as integrated circuit is fabricated utilizing the processes shown in FIG. 1. The deterioration of the device due to the irradiation with a light is suppressed compared to existing photoresists since times for irradiation of the coating film is shortened by photosensitization reaction using the primary product generated from Reagent 1 or the secondary product generated from the primary product.

What is claimed is:

1. A composition comprising:
a reagent; and
a photoacid generator or an initiator generating base,
wherein the reagent is represented by the following formula, where:
R$^1$ is selected from the group consisting of a hydrogen atom, a halogen atom, a silyl group, germyl group and stannyl group;
R$^2$ is selected from the group consisting of a hydrogen atom, an alkyl group, an alkenyl group, an aryl group, an aralkyl group, and an alkynyl group;
R$^3$ is selected from the group consisting of a hydrogen atom, an alkyl group, an alkenyl group, an aryl group, an aralkyl group, and an alkynyl group;
R$^4$ is selected from the group consisting of a hydrogen atom, an alkyl group, an alkenyl group, an aryl group, an aralkyl group, and an alkynyl group;
R$^5$ is selected from the group consisting of an alkyl group, an alkenyl group, an aryl group, an aralkyl group, and an alkynyl group;
R$^6$ is selected from the group consisting of a hydrogen atom, a halogen atom, a silyl group, germyl group and stannyl group;
at least one of R$^2$ and R$^4$ is an aryl group;
the aryl group optionally has at least one electron-donating group or at least on electron-accepting group; and
eliminations of R$^1$ and R$^6$ is able to occur through an exposure of at least one of the composition, a solution of the composition and a film formed of the composition to at least one of an electromagnetic ray and a particle ray.

2. The composition of claim 1, wherein each of R$^2$ and R$^4$ is an aryl group.

3. The composition of claim 2, wherein each of R$^3$ and R$^5$ is a hydrogen atom.

4. The composition of claim 1, wherein: the electron-donating group is selected from the group consisting of alkyl group, hydroxy group, alkoxy group, ariloxy group, amino group, alkylamino group, alkylthio group and arylthio group; and
wherein, the electron-accepting group is selected from the group consisting of nitro group, cyano group, trifluoromethyl group, halogen group, ammonium group and sulfonium group.

5. A method for manufacturing a device comprising:
coating the composition of claim 1 on a wafer to form a coating film;
a first-irradiating the coating film with an EUV light or an electron beam; and
developing the coating film irradiated with an EUV light or the electron beam.

6. The method of claim 5, wherein the reagent is converted to a radical compound represented by the following formula by the first irradiating, where each of R$^2$-R$^6$ is same as those of the reagent.

7. The method of claim 5, wherein the reagent is converted to an olefin compound by the following formula by the first irradiating, where each of R$^2$-R$^5$ is same as those of the reagent.

8. The method of claim 7 further comprising a second irradiating an UV light to the coating film irradiated with an EUV light or the electron beam after the first irradiating.

9. The method of claim 8, wherein the olefin compound is under photochemical intramolecular cyclization by the second irradiating.

10. The method of claim 9, wherein the olefin compound is converted to a phenanthrene derivative.

* * * * *

UNITED STATES PATENT AND TRADEMARK OFFICE
CERTIFICATE OF CORRECTION

PATENT NO. : 9,488,915 B2  
APPLICATION NO. : 14/547097  
DATED : November 8, 2016  
INVENTOR(S) : Takashi Miyazawa Page 1 of 1

It is certified that error appears in the above-identified patent and that said Letters Patent is hereby corrected as shown below:

On the Title Page  
In ITEM (72) Inventors: change "Takashi Miyazawa, Inzai (JP)"  
to --Takashi Miyazawa, Inzai-shi (JP)--

In the Specification  
Column 6, Line 62, change "forth product" to --fourth product--  
Column 6, Line 64, change "forth product" to --fourth product--  
Column 13, Lines 53,54 change "dicyclopentadienylpiatinum (II) chloride" to --dicyclopentadienylplatinum (II) chloride--  
Column 14, Line 55, change "by Reagent 1. In" to --by Reagent 1. In--

Signed and Sealed this  
Twenty-fifth Day of April, 2017

Michelle K. Lee  
*Director of the United States Patent and Trademark Office*